US008937299B2

(12) United States Patent
Basu et al.

(10) Patent No.: US 8,937,299 B2
(45) Date of Patent: Jan. 20, 2015

(54) III-V FINFETS ON SILICON SUBSTRATE

(71) Applicant: International Business Machines Corporation, Armonk, NY (US)

(72) Inventors: Anirban Basu, Elmsford, NY (US); Cheng-Wei Cheng, White Plains, NY (US); Amlan Majumdar, White Plains, NY (US); Ryan M. Martin, New York, NY (US); Uzma Rana, Chappaqua, NY (US); Devendra K. Sadana, Pleasantville, NY (US); Kuen-Ting Shiu, White Plains, NY (US); Yanning Sun, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 13/967,102

(22) Filed: Aug. 14, 2013

(65) Prior Publication Data

US 2014/0264446 A1    Sep. 18, 2014

Related U.S. Application Data

(63) Continuation of application No. 13/800,398, filed on Mar. 13, 2013.

(51) Int. Cl.
*H01L 29/78*     (2006.01)
*H01L 29/267*    (2006.01)
*H01L 29/49*     (2006.01)
*H01L 29/51*     (2006.01)

(52) U.S. Cl.
CPC .................................. *H01L 29/785* (2013.01)
USPC ............. 257/24; 357/365; 357/401; 357/409; 357/745; 438/300

(58) Field of Classification Search
USPC .......................................................... 257/365
See application file for complete search history.

(56) References Cited

U.S. PATENT DOCUMENTS

| 7,074,623 B2 | 7/2006 | Lochtefeld et al. |
| 7,799,592 B2 | 9/2010 | Lochtefeld |

(Continued)

OTHER PUBLICATIONS

Hill, R., et al. "Self-Aligned III-V Mosfets Heterointegrated on a 200 MM Si Substrate Using an Industry Standard Process Flow" Electron Devices Meeting (IEDM), 2010 IEEE International. Dec. 2010. pp. 1-4.

(Continued)

*Primary Examiner* — Olik Chaudhuri
*Assistant Examiner* — Charles N Ausar-El
(74) *Attorney, Agent, or Firm* — Tutunjian & Bitetto, P.C.; Louis J. Percello

(57) ABSTRACT

A method for forming fin field effect transistors includes forming a dielectric layer on a silicon substrate, forming high aspect ratio trenches in the dielectric layer down to the substrate, the high aspect ratio including a height to width ratio of greater than about 1:1 and epitaxially growing a non-silicon containing semiconductor material in the trenches using an aspect ratio trapping process to form fins. The one or more dielectric layers are etched to expose a portion of the fins. A barrier layer is epitaxially grown on the portion of the fins, and a gate stack is formed over the fins. A spacer is formed around the portion of the fins and the gate stack. Dopants are implanted into the portion of the fins. Source and drain regions are grown over the fins using a non-silicon containing semiconductor material.

10 Claims, 10 Drawing Sheets

(56) References Cited

U.S. PATENT DOCUMENTS

| | | |
|---|---|---|
| 8,183,627 B2 | 5/2012 | Currie |
| 8,264,032 B2 | 9/2012 | Yeh et al. |
| 2006/0197129 A1 | 9/2006 | Wohlmuth |
| 2009/0200604 A1* | 8/2009 | Chidambarrao et al. ..... 257/329 |
| 2011/0024794 A1 | 2/2011 | Ko et al. |
| 2012/0001239 A1 | 1/2012 | Ko et al. |
| 2012/0018813 A1* | 1/2012 | Holmes et al. ................ 257/392 |
| 2013/0089958 A1* | 4/2013 | Yeh et al. ...................... 438/197 |
| 2013/0126985 A1* | 5/2013 | Cheng et al. .................. 257/411 |
| 2013/0228866 A1* | 9/2013 | Lee et al. ...................... 257/355 |

OTHER PUBLICATIONS

Orzali, T., et al. "In-Situ HCL Etching of INP in Shallow-Trench-Isolated Structures" ECS Transactions, vol. 41, Issue 7. Oct. 2011. pp. 345-354.

Radosavljevic, M., et al. "Electrostatics Improvement in 3-D Tri-Gate Over Ultra-Thin Body Planar INGAAS Quantum Well Field Effect Transistors With High-K Gate Dielectric and Scaled Gate-To-Drain/Gate-To-Source Separation" Electron Devices Meeting (IEDM), 2011 IEEE International. Dec. 2011. pp. 1-4.

\* cited by examiner

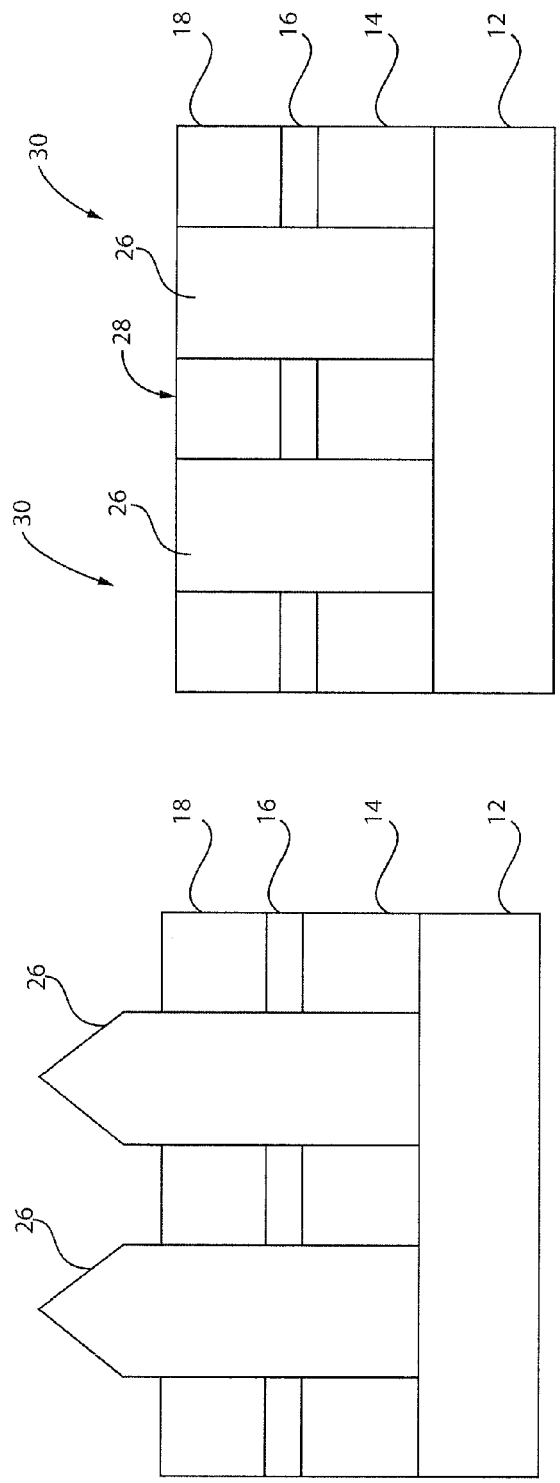

us 8,937,299 B2

III-V FINFETS ON SILICON SUBSTRATE

RELATED APPLICATION DATA

This application is a Continuation application of co-pending U.S. patent application Ser. No. 13/800,398 filed on Mar. 13, 2013, incorporated herein by reference in its entirety.

BACKGROUND

1. Technical Field

The present invention relates to semiconductor processing and devices, and more particularly to forming fin field effect transistors with III-V materials on silicon.

2. Description of the Related Art

Processing of silicon wafers is the most frequently employed type of wafer processing. The maturity and popularity of silicon wafer processing results in cost savings for its use, and only silicon substrates are suitable for mass manufacture due at least in part to their mechanical and electrical properties. However, many applications can benefit from mass-produced, higher-performance III-V materials.

Fin field effect transistors (finFETs) are becoming more widely used for scaling down transistors on semiconductor devices. However, no bottom-up approach is currently available that employs mass-production substrates with III-V materials for finFETs.

SUMMARY

A method for forming fin field effect transistors includes forming a dielectric layer on a silicon substrate, forming high aspect ratio trenches in the dielectric layer down to the substrate, the high aspect ratio including a height to width ratio of greater than about 1:1 and epitaxially growing a non-silicon containing semiconductor material in the trenches using an aspect ratio trapping process to form fins. The one or more dielectric layers are etched to expose a portion of the fins. A barrier layer is epitaxially grown on the portion of the fins, and a gate stack is formed over the fins. A spacer is formed around the portion of the fins and the gate stack. Dopants are implanted into the portion of the fins. Source and drain regions are grown over the fins using a non-silicon containing semiconductor material.

Another method for forming fin field effect transistors includes forming one or more dielectric layers on a silicon substrate; forming high aspect ratio trenches in the one or more dielectric layers down to the substrate, the high aspect ratio including a height to width ratio of greater than about 1:1; epitaxially growing a non-silicon containing semiconductor material in the trenches using an aspect ratio trapping process to form fins; etching the one or more dielectric layers to expose a portion of the fins; epitaxially growing a barrier layer on the portion of the fins; forming a gate stack over the fins in a transverse orientation relative to a longitudinal direction of the fins; forming a spacer around the portion of the fins and the gate stack; etching the fins below at least a portion of the spacers; and growing source and drain regions over a remaining portion of the fins using a non-silicon containing semiconductor material.

A fin field effect transistor includes a substrate formed from a monocrystalline silicon or germanium material. A dielectric layer has trenches formed therein. A plurality of parallel fins is formed from a III-V material in the trenches and is in contact with the substrate. The trenches are initially dimensioned and configured to have a high aspect ratio including a height to width ratio of greater than about 1:1 to enable non-lattice-matched crystalline III-V material to be formed on the substrate. A gate stack includes a barrier layer, a gate dielectric and a gate conductor formed transversely to the plurality of parallel fins. Raised source and drain regions are formed from a III-V material and are in contact with the fins on opposite sides of the gate stack.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 4 is a cross-sectional view of the device of FIG. 2 having the high aspect ratio trenches filled with epitaxially grown non-silicon material (e.g., III-V material) formed using aspect ratio trapping in accordance with the present principles;

FIG. 5 is a cross-sectional view of the device of FIG. 4 after planarization of the epitaxially grown non-silicon material in accordance with the present principles;

FIG. 6 is a cross-sectional view of the device of FIG. 5 after recessing a first dielectric layer to expose the fins in accordance with the present principles;

DETAILED DESCRIPTION OF PREFERRED EMBODIMENTS

Figure 1:
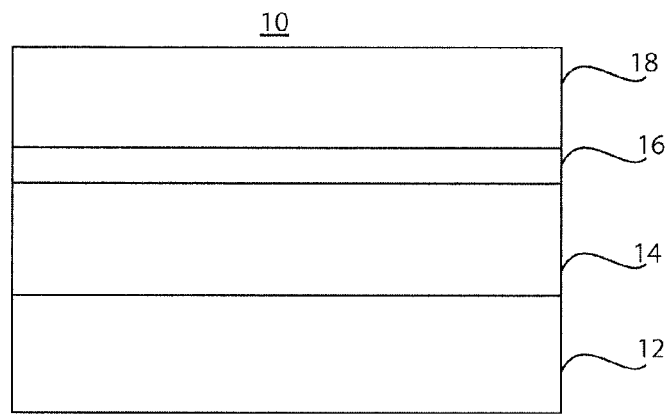
FIG. 1 is a cross-sectional view of a device having a substrate, preferably silicon, with three dielectric layers formed thereon in accordance with the present principles.

In accordance with the present principles, non-silicon material (e.g., III-V) fin field effect transistors (finFETs) are provided on silicon substrates. The present embodiments provide a number of variations for the finFET integration process. For example, while the present embodiments describe gate first, self-aligned, finFETs, the finFETs may also be formed using a gate last self-aligned, III-V finFET, a non-self-aligned, III-V finFET or these with other finFET materials. In addition, embodiments described herein may include implanted finFET extension regions or include fin chopping embodiments. In accordance with the present principles, silicon and non-silicon semiconductor materials can be combined on a same chip. For example, a III-V material, such as, indium phosphide and a group IV material, such as germanium can be integrated on a same device, which can provide structures for both the emission and detection of light, on silicon. In this way, manufacturers could combine the light handling and electronic functionalities of photonic devices in one chip. This reduces a cost of packaging multiple chips in a module and of module-level integration and chip interconnection. While many combinations of materials are possible in accordance with the present principles, particularly useful embodiments will describe the use of a silicon substrate with III-V materials for forming finFETs.

It is to be understood that the present invention will be described in terms of a given illustrative architecture having a silicon wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip. A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed compounds with listed elements, e.g., III-V elements, such as, e.g., InGaAs, InP, GaAs or GaP. These compounds include different proportions of the elements within the compound, e.g., InGaAs includes $In_x Ga_y As_{1-x-y}$, where x, y are less than or equal to 1, or GaAs includes $Ga_x As_{1-x}$ where x is less than or equal to 1, etc. In addition, other elements may be included in the compound, such as, e.g., AlInGaAs, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a semiconductor device 10 having a silicon-containing substrate 12 with dielectric layers 14, 16 and 18 formed thereon is shown in accordance with the present principles. While the substrate 12 preferably includes monocrystalline silicon, it should be understood that SiGe, SiC, Ge, etc. may be employed. The substrate 12 should be cleaned, e.g., by an RCA process or the like prior to formation of any layers thereon.

Dielectric layer 14 may include an oxide or a nitride. Examples of oxides include $SiO_2$, $Al_2O_3$, etc., and examples of nitrides include SiN, SiON, etc. Dielectric layer 16 may be considered an etch stop layer, and includes a material that is selectively etchable relative to the layers 18 and 14. In particular, a high etching selectivity is needed between layers 16 and 18. In one example, layer 16 may include SiN while layer 18 may include $SiO_2$ (or vice versa). The dielectric layers 14, 16 and 18 may be formed by known processes, which may include chemical vapor deposition, although others methods are also contemplated.

Figure 2:
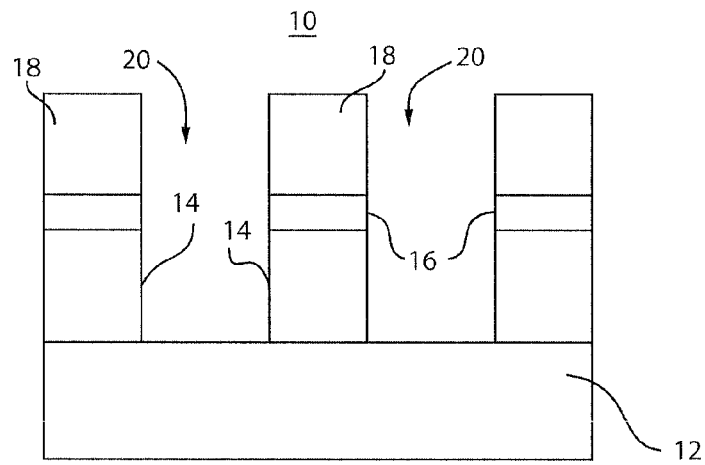
FIG. 2 is a cross-sectional view of the device of FIG. 1 having high aspect ratio trenches formed down to the substrate in accordance with the present principles.
Figure 3:
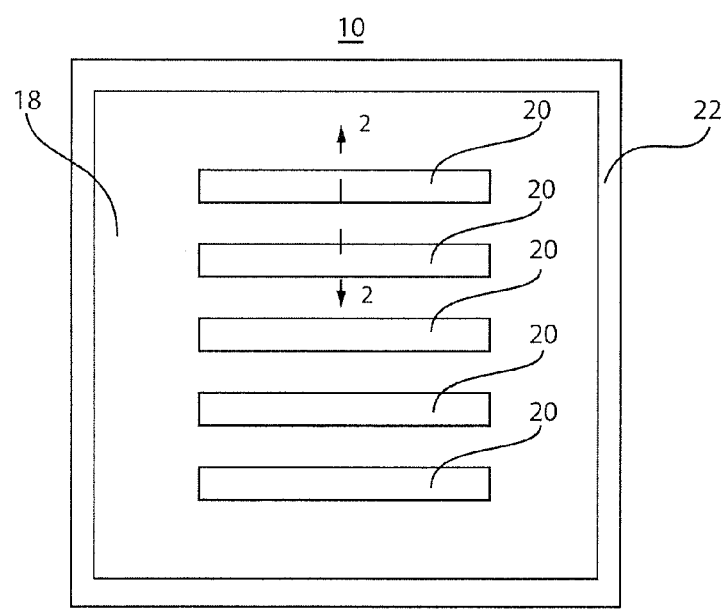
FIG. 3 is a top view showing the trenches formed in the dielectric layers and showing a guard-ring area in accordance with the present principles.

Referring to FIG. 2, trenches 20 are formed in the dielectric layers 14, 16 and 18 down to the substrate 12. The trenches 20 are preferably high in aspect ratio, e.g., 1:1 (depth to width) or greater. The trenches 20 are formed by patterning a mask and performing a reactive ion etch process. FIG. 2 is a cross-section taken at section line 2-2 of FIG. 3. FIG. 3 shows a top view of the device 10 with the trenches patterned (etched) into the dielectric layers 14, 16 and 18. In addition, an optional guard-ring or ring 22 may be formed around and edge of the device 10. The guard-ring 22 is provided to avoid loading effects during epitaxial growth in later steps. The guard-ring 22 is formed by removing the dielectric layers 14, 16 and 18 to expose the underlying silicon of the substrate 12. The guard-ring 22 may take on many different patterns or shapes that may depend upon the layout of the components formed on the device 10.

Referring to FIG. 4, III-V material 26 is epitaxially grown in the trenches 20. The epitaxial growth starts on the silicon substrate 12 and fills the trenches 20 and grows on the silicon substrate 12 in the guard-ring 22 area. In one embodiment, a high-aspect ratio trapping (ART) technique is employed to grow the III-V material. ART is employed to create a relatively defect free monocrystalline structure for a semiconductor compound (e.g., III-V materials 26). Defects are suppressed in the lattice of materials 26 at the non-crystalline sidewalls of the dielectric layer 14, 16, and 18, especially where the sidewalls are relatively high with respect to the growth area (e.g., 1:1 aspect ratio or greater). The ART technique takes advantage of the geometry of the confined spaces. The growth of the materials 26 is permitted directly on the substrate 12 even though a lattice-mismatch would normally be present between Si and III-V materials (or other materials). The III-V material may include GaAs, InGaAs, AlInGaAs, AlGaAs, GaP, InGaP, InP, InAs, GaN, GaSb, InSb, etc., combinations of these and alloys thereof. It should be understood that other materials may also be formed instead of III-V compounds for material 26, e.g., II-VI compounds, such as ZnO, ZnSe, etc.

Referring to FIG. 5, a planarization step is performed to planarize a top surface 28. The planarization step planarizes the epitaxial material 26 in the trenches 20 and in the guard-ring region 22 (FIG. 3). The planarization may include a chemical mechanical polish (CMP). The epitaxial material 26 now forms fins 30, which will be employed in forming finFETs in later steps.

Referring to FIG. 6, dielectric layer 18 is selectively removed relative to dielectric layer 16 and the fins 30. The selective removal of dielectric layer 18 may include a reactive ion etch although other etching processes may be employed.

Figure 7:
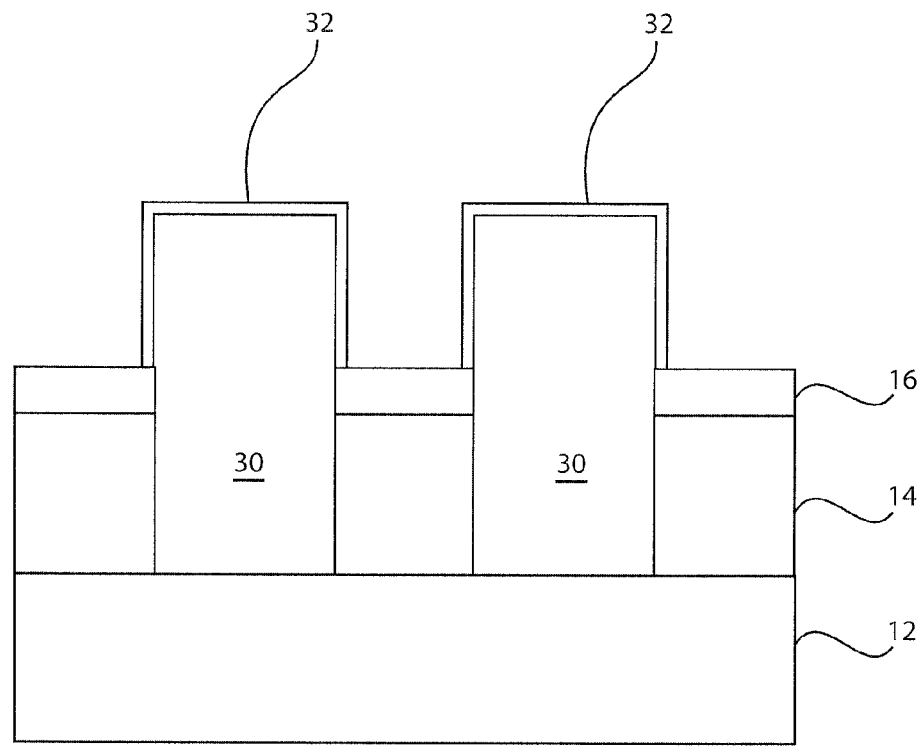
FIG. 7 is a cross-sectional view of the device of FIG. 6 after forming a barrier layer over the exposed portion of the fins in accordance with the present principles.

Referring to FIG. 7, a barrier layer 32 is grown on a top portion of the fins 30. The barrier layer 32 provides passivation to the sidewalls of the fins 30. The barrier layer 32 includes a high bandgap material, preferably a doped semiconductor material that can be easily grown by epitaxial growth. The barrier layer 32 may include a thickness of 1-5 nm depending on the size of the fins 30. In one embodiment, the fins include a III-V material and the barrier layer 32 may include InP, InAlAs or the like.

Figure 8:
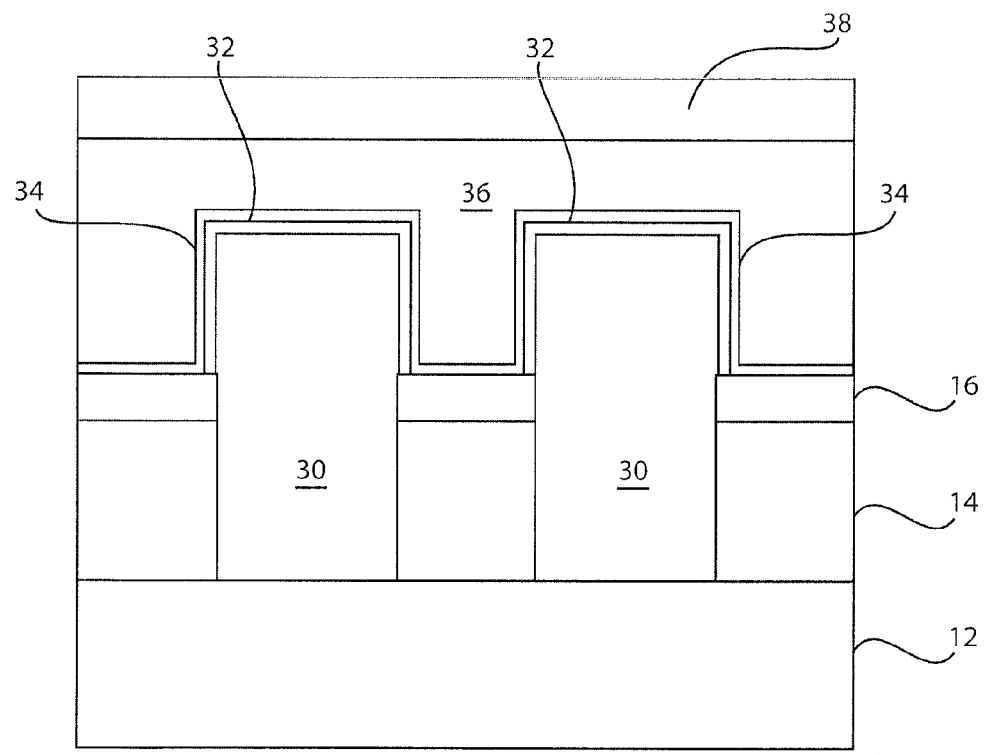
FIG. 8 is a cross-sectional view taken at section line 8-8 of FIG. 9 showing a gate stack formed over the fins in accordance with the present principles.

Referring to FIG. 8, gate formation is provided. This may include surface passivation of the barrier layer 32 by subjecting the barrier layer 32 to a passivation material, such as, e.g., amorphous silicon. Next, a gate dielectric 34 is formed. The gate dielectric 34 may include a high-dielectric constant (hi-K) material, such as $SiO_2$, SiON, $HfO_2$, etc. deposited over the barrier layer 32 of the fins 30 and dielectric layer 16. A gate conductor 36 is deposited over the gate dielectric 34. The gate conductor 36 may include a metal or metal compound, such as Cu, Al, W, TiN, etc. or alloys thereof. In one embodiment, a doped semiconductor material may be employed. An optional gate conductor planarization step may be performed. A gate dielectric cap 38 is formed over the gate conductor 36. The gate cap 38 may include SiN or other dielectric material.

Figure 9:
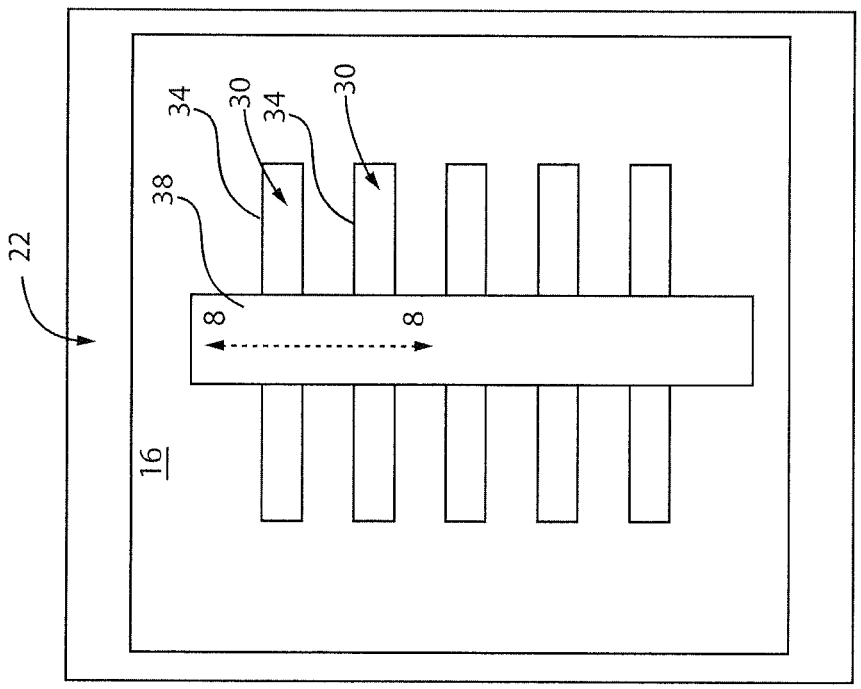
FIG. 9 is a top view showing the gate stack formed over the fins in accordance with the present principles.

Referring to FIG. 9, a gate stack 40 includes the gate dielectric 34, the gate conductor 36 and the gate cap 38. The gate stack 40 is patterned using lithographic masking and etching to expose the fins 30 or the barrier layer 34 on the fins 30. The etching may include a reactive ion etch process. The section shown in FIG. 8 is taken at section line 8-8 in FIG. 9. This is a gate first design, which refers to the gate being formed before source and drain regions. Gate last refers to forming the gate after the source and drain regions, which may be provided by changing the gate stack to include a dummy gate, which would be removed and replaced by the gate conductor later in the process.

Figure 10:
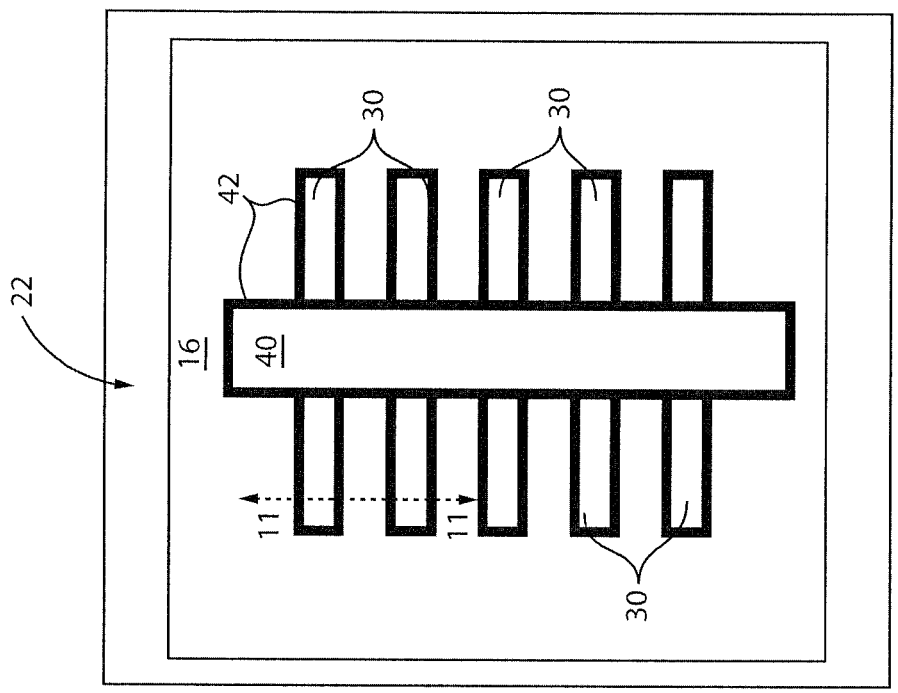
FIG. 10 is a top view showing a spacer formed around the gate stack and the fins in accordance with the present principles.
Figure 11:
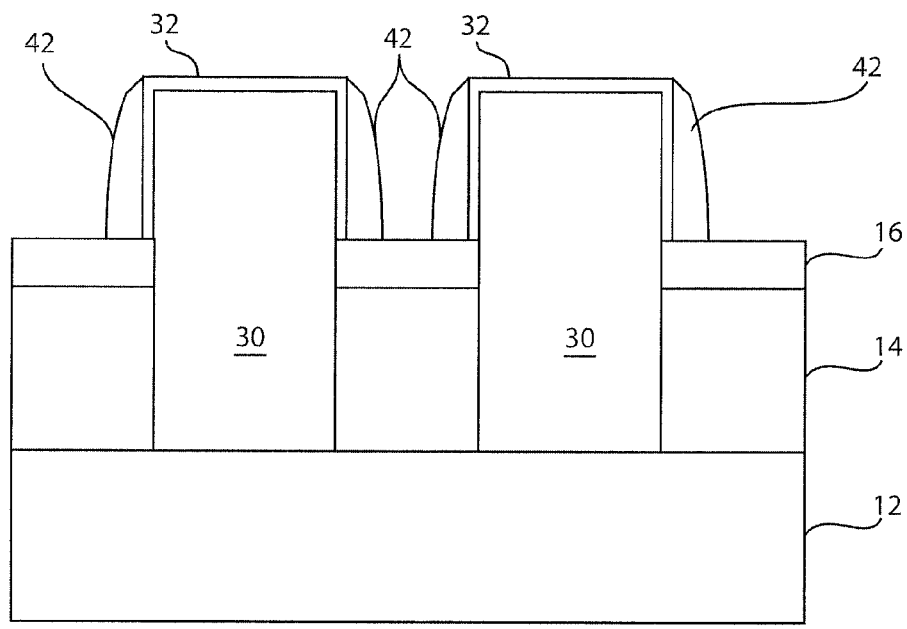
FIG. 11 is a cross-sectional view taken at section line 11-11 of FIG. 10 after forming the spacer over the device of FIG. 7 in accordance with the present principles.

Referring to FIG. 10, a spacer deposition and etch is performed to form spacers 42 around fins 30 and the gate stack 40. In one embodiment, a silicon nitride is deposited followed by a reactive ion etch process to form the sidewall spacers 42. FIG. 11 shows a cross-sectional view taken at section line 11-11 of FIG. 10 showing the spacers 42 as thick lines formed on sidewalls of the fins 30.

Figure 12:
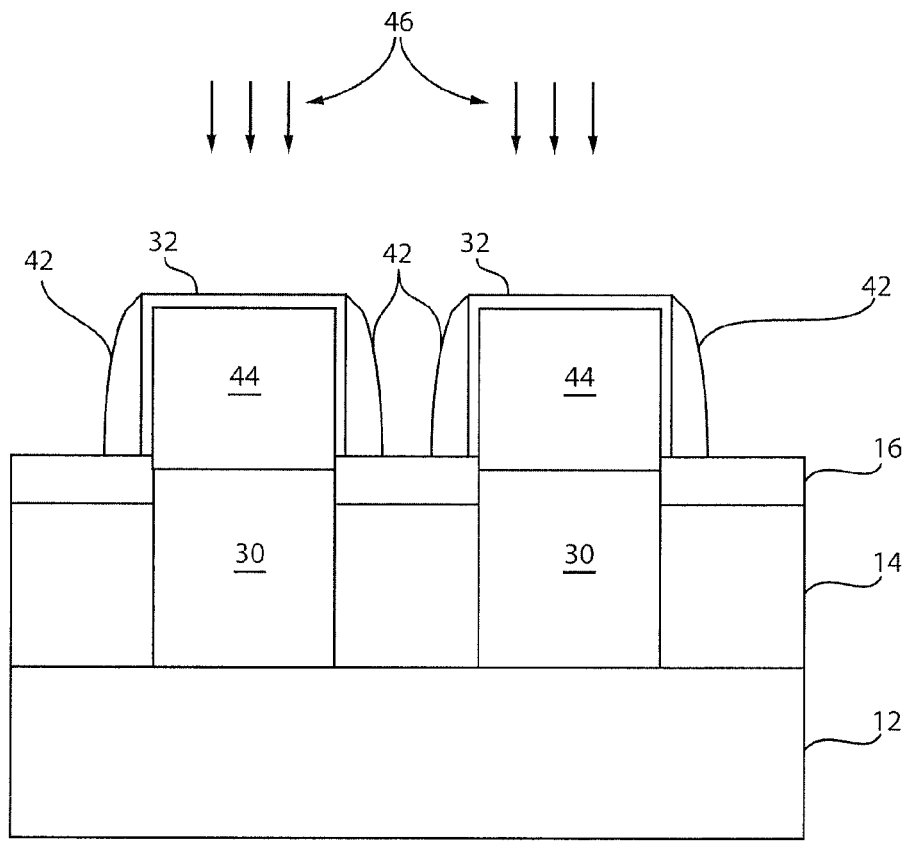
FIG. 12 is a cross-sectional view of the device of FIG. 11 after dopant implantation of a top portion of the fins in accordance with the present principles.

Referring to FIG. 12, extension implants are performed. An optional block mask (not shown) may be formed to protect the guard-ring area 22 and selected fins 30 from ion implantation. The fins 30 are subject to dopant (ion) implantation to form doped regions 44. The ion implantation may employ Si, or other dopants S, Se, etc. depending on the desired conductivity and function of the fins 30. Then, if a block mask is employed, it is stripped. The block mask may include a resist material. Next, a thermal activation process (e.g., an anneal) is performed to diffuse/activate the dopants within the fins 30. It should be noted that in many embodiments, less than the entire depth of the fin 30 is doped by the extension dopant process.

Figure 13:
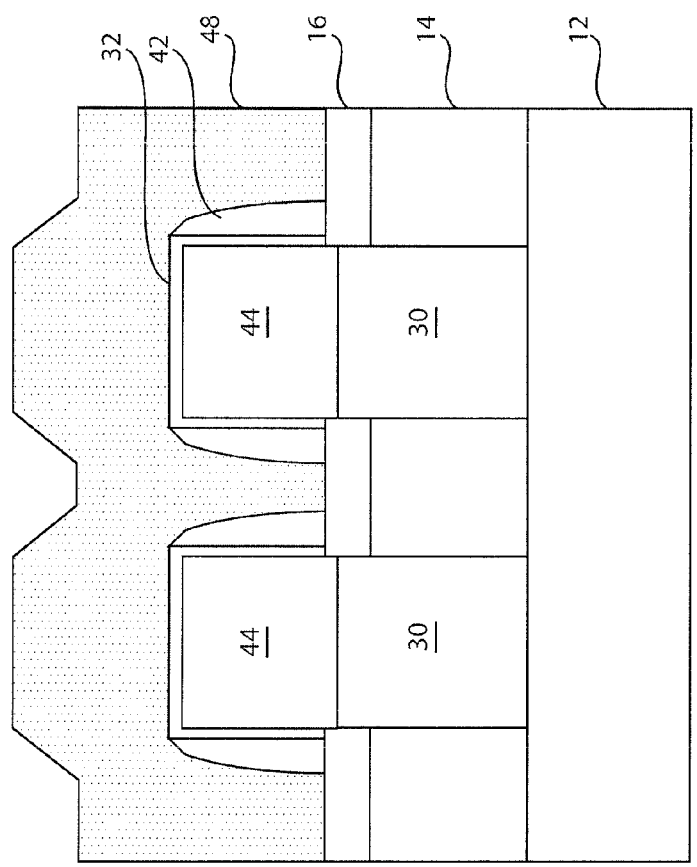
FIG. 13 is a cross-sectional view taken at section line 13-13 of FIG. 14 showing the device of FIG. 12 after growing raised source and drain regions over the fins in accordance with the present principles.

Referring to FIG. 13, an epitaxial growth process is performed to grow raised source and drain (RSD) regions 48. The RSD regions 48 are grown on barrier layer 32 or directly on doped portions 44 of fins 30. The RSD regions 48 are self-aligned to the fins 30. The RSD regions 48 may include a material compatible with the material of the barrier layer 32 and/or the fins 30. For example, if the fins 30 and/or the barrier layer 32 include III-V material then the RSD regions 48 include a III-V material. In one embodiment, the RSD regions 48 include InGaAs although other materials may be employed. The RSD regions 48 are preferably doped in-situ with the appropriate concentration, type and conductivity. In other embodiments, the RSD regions 48 may not be self-aligned and may need to be aligned with the fins 30.

Figure 14:
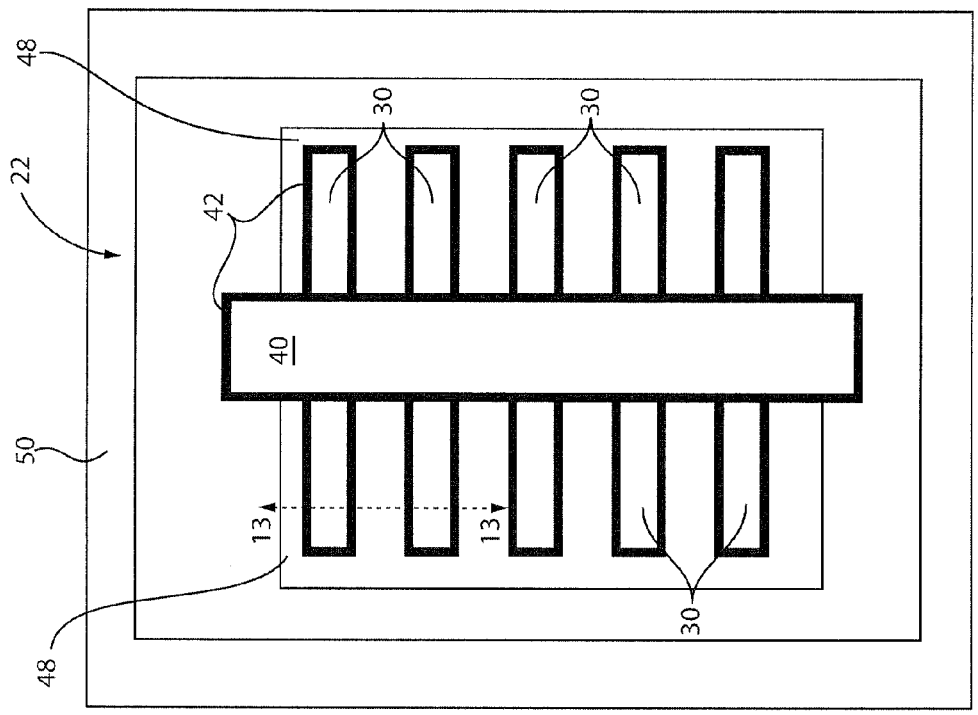
FIG. 14 is a top view showing the raised source and drain regions in accordance with the present principles.

Referring to FIG. 14, the RSD regions 48 are formed on sides of the gate stack 40. The RSD region 48 on one side of the gate stack 40 is a source region while the RSD region 48 on the other side of the gate stack 40 is the drain region. The RSD regions 48 merge multiple fins 30 together. The fins 30, and in particular the doped portions 44 of the fins 30, act to conduct across a channel below the gate stack 40 between the source and drain regions when the device is active. A block mask 50 may be formed and patterned over the guard-ring area 22 to prevent metal deposition over the guard ring area 22 in the next step.

Figure 15:
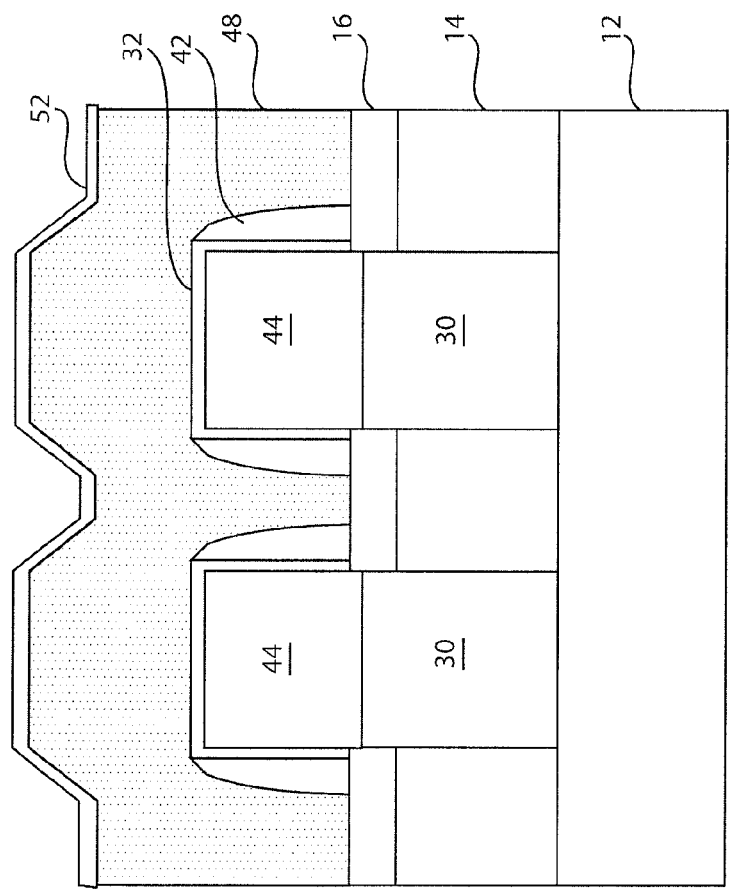
FIG. 15 is a cross-sectional view of the device of FIG. 13 after forming a metal layer over the raised source and drain regions in accordance with the present principles.

Referring to FIG. 15, a metal 52 is deposited over the device. The metal 52 may include, e.g., Ni, Co, Pt, although other metals may be employed. A strip resist process is employed to remove the block mask 50 (FIG. 14), which in turn, removes any metal in the guard-ring area 22. A rapid thermal anneal process is employed to cause mixing between the metal 52 and the material of the RSD regions 48, e.g., metal-III-V mixing, and in particular, Ni—InGaAs. A selective etch may be employed to remove unreacted metal 52.

Figure 16:
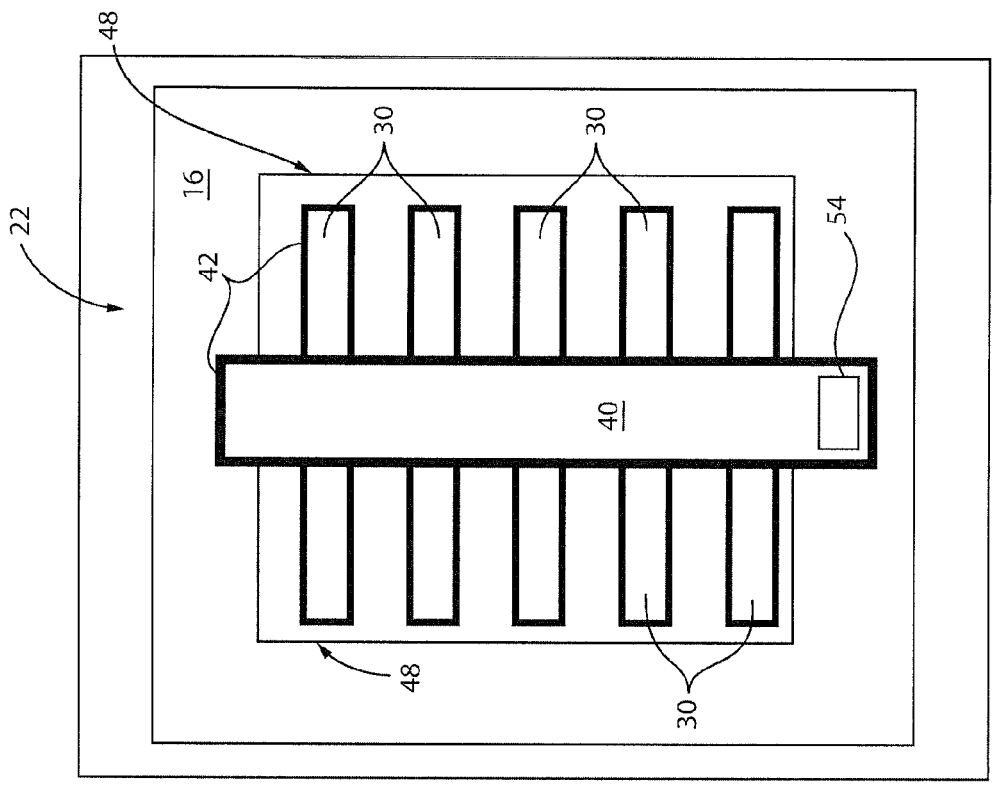
FIG. 16 is a top view showing a gate dielectric opening formed to access the gate conductor in accordance with the present principles.

Referring to FIG. 16, a gate pad open process is performed to gain access to the gate conductor 36 (FIG. 8). A resist is deposited (not shown) and lithographically patterned to open a window or windows at a position or positions on the gate stack 40. A reactive ion etch is performed to open up the gate cap 38 to form a gate pad opening 54. The resist is then stripped off Processing then continues as is known in the art to form upper metallizations and other back-end processing. The fins 30 form finFETs from, e.g., III-V material on a silicon substrate. The fins 30 and the RSD regions 48 include III-V materials and therefore enjoy the benefits of the performance enhancement provided when these materials are employed. In addition, the cost is reduced and the manufacturing is easier by employing the silicon substrate and the well-developed and less expensive silicon wafer fabrication processing.

Figure 17:
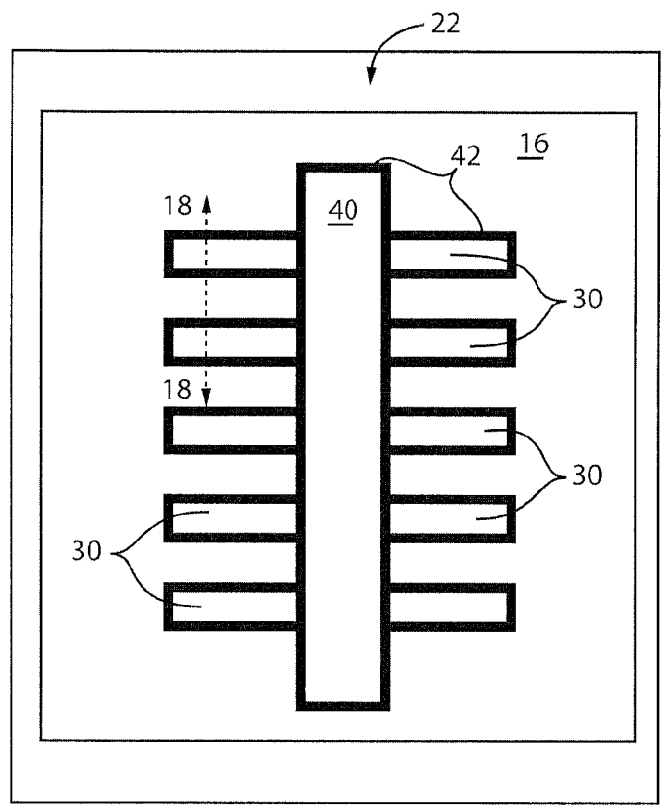
FIG. 17 is a top view showing the etching away of a portion of the fins (fin chopping) in accordance with the present principles.
Figure 18:
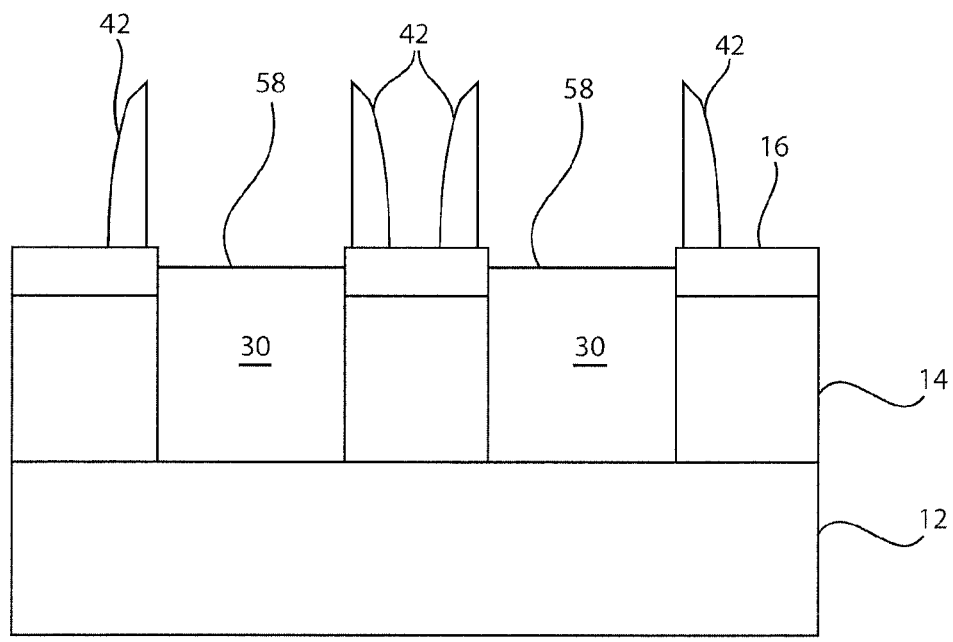
FIG. 18 is a cross-sectional view taken at section line 18-18 of FIG. 17 and showing the device of FIG. 11 after etching away a portion of the fins (fin chopping) in accordance with the present principles.

Referring to FIG. 17, an alternate embodiment employs the same process as described above with reference to FIGS. 1-11 in growing non-silicon semiconductor material on a silicon substrate. The spacer 42 and barrier layer 32 are formed as before. FIG. 17 shows a section line 18-18 for a cross-section as shown in FIG. 18. FIG. 17 shows the spacer 42 formed, as before around the gate stack 40 and the fins 30.

Referring to FIG. 18, a fin chopping process is carried out to remove a portion of the fins 30. An etch process is performed which is selective to the dielectric layer 16, spacer 42 and the gate cap material 38 of the gate stack 40. The etch may etch a top surface 58 of the fins 30 below the spacers 42 and remove the barrier layer 32 in the fin area (the barrier layer 32 remains under the area of the gate stack 40, FIG. 17). While it is advantageous to stop the etch within layer 16 (due to the selective etch chemistry), the etch may be adjusted (timed) to etch deeper as needed or desired.

Figure 19:
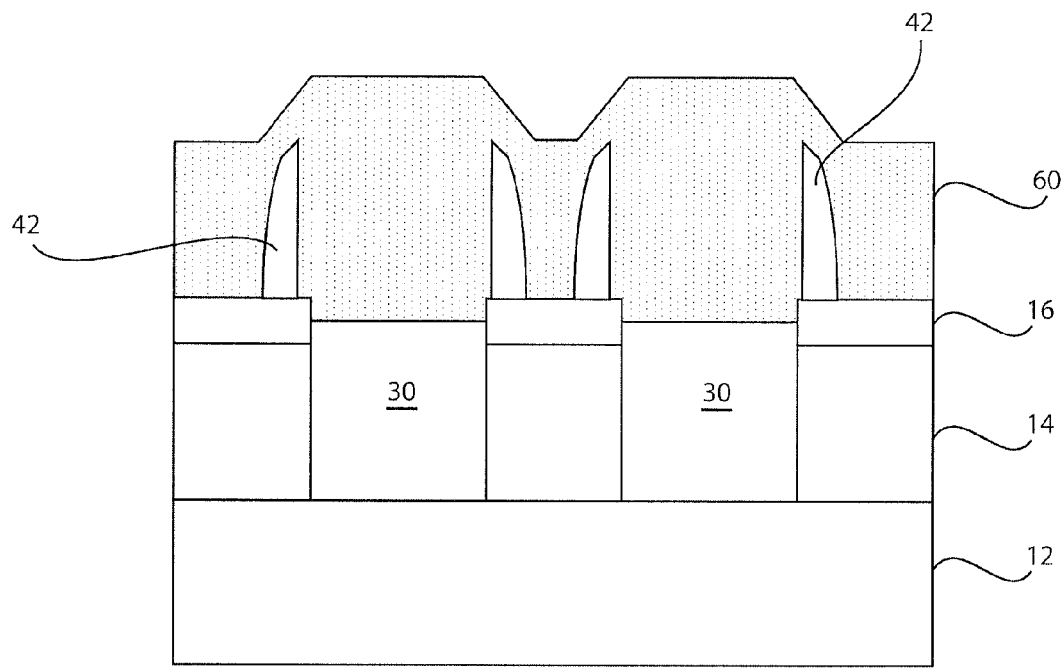
FIG. 19 is a cross-sectional view of the device of FIG. 18 after growing raised source and drain regions over the fins in accordance with the present principles.

Referring to FIG. 19, an epitaxial growth process is performed to grow raised source and drain (RSD) regions 60. The RSD regions 60 are grown on the fins 30 and over the spacers 42. The RSD regions 60 are self-aligned to the fins 30. The RSD regions 60 may include a material compatible with the material of the fins 30. For example, if the fins 30 include III-V material then the RSD regions 60 include a III-V material. The RSD regions 60 are preferably doped in-situ with the appropriate concentration, type and conductivity.

In one embodiment, the RSD regions 60 include InGaAs although other materials may be employed. The RSD regions 60 are formed on sides of the gate stack 40. The RSD region 60 on one side of the gate stack 40 is a source region while the RSD region 60 on the other side of the gate stack 40 is the drain region (as in FIG. 14). The RSD regions 60 merge multiple fins 30 together. The fins 30 act to conduct across a channel below the gate stack 40 between the source and drain regions when the device is active. The block mask 50 is formed and patterned over the guard-ring area 22 to prevent metal deposition over the guard ring area 22 in the next step (see FIG. 14).

Figure 20:
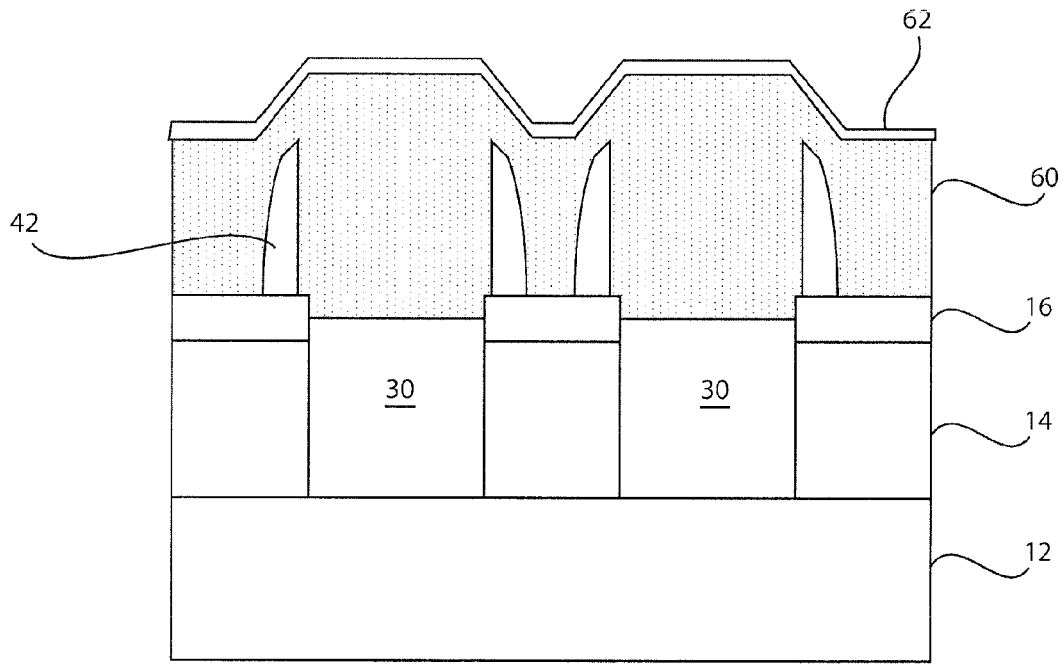
FIG. 20 is a cross-sectional view of the device of FIG. 19 after forming a metal layer over the raised source and drain regions in accordance with the present principles.

Referring to FIG. 20, a metal 62 is deposited over the device. The metal 62 may include, e.g., Ni, Co, Pt, although other metals may be employed. A strip resist process is employed to remove the block mask 50 (FIG. 14), which in turn, removes any metal in the guard-ring area 22. A rapid thermal anneal process is employed to cause mixing between the metal 62 and the material of the RSD regions 60, e.g., metal-III-V mixing, and in particular, Ni—InGaAs. A selective etch may be employed to remove unreacted metal 62. A gate pad open process as in FIG. 16 is performed followed by conventional back-end processing. The fins 30 form finFETs from, e.g., III-V material on a silicon substrate. The fins 30 and the RSD regions 60 include III-V materials and therefore enjoy the benefits of the performance enhancement provided when these materials are employed. In addition, the cost is reduced and the manufacturing is easier by employing the silicon substrate and the well-developed and less expensive silicon wafer fabrication processing.

Figure 21:
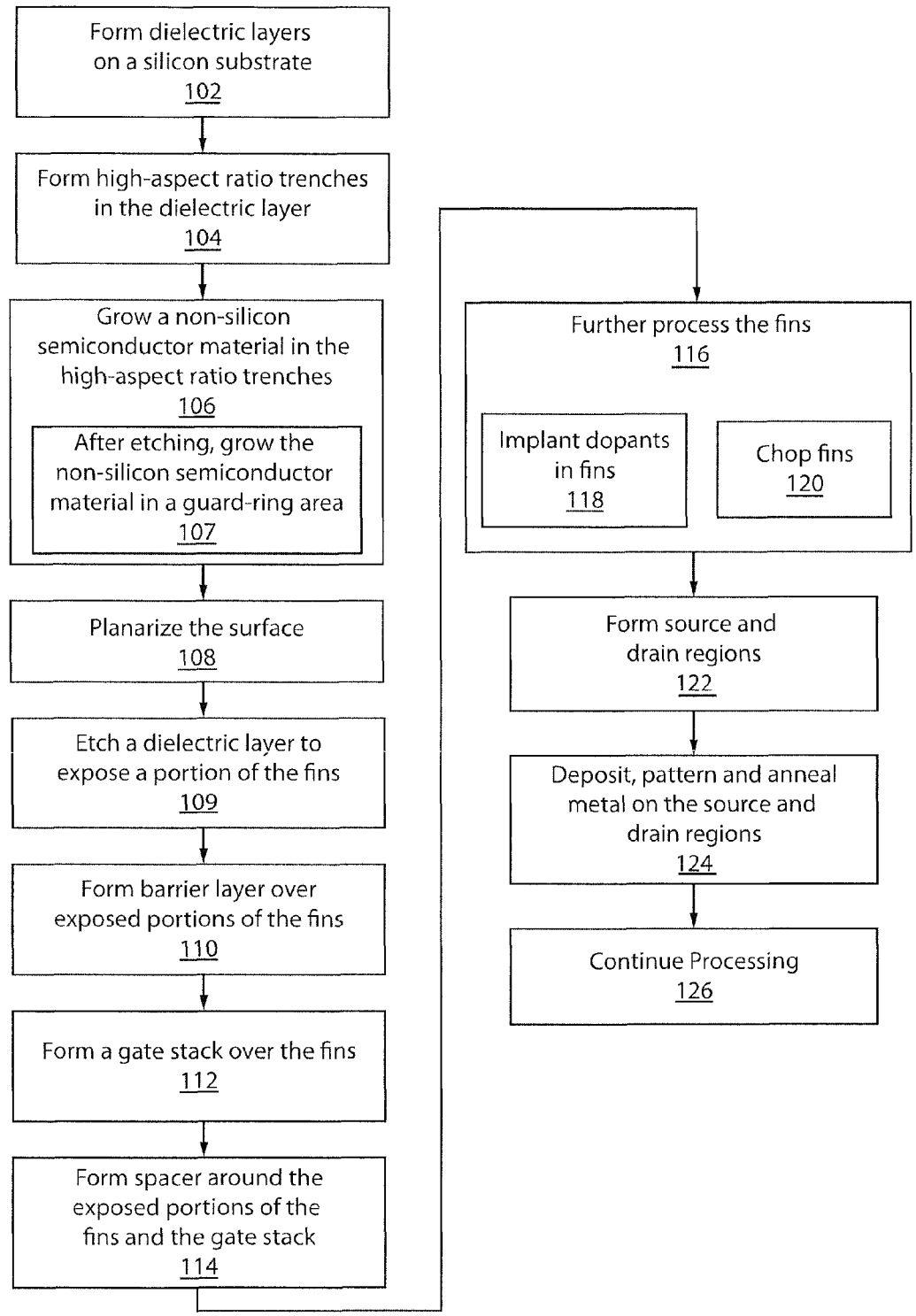
FIG. 21 is a block/flow diagram showing method for forming finFET devices in accordance with illustrative embodiments.

Referring to FIG. 21, methods for forming fin field effect transistors are illustratively shown. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 102, one or more dielectric layers are formed on a silicon substrate. The substrate may also include silicon compounds or Ge. In block 104, high aspect ratio trenches are formed in the one or more dielectric layers down to the substrate. The high aspect ratio includes a height to width ratio of greater than about 1:1. In block 106, a non-silicon containing semiconductor material is epitaxially grown in the trenches using an aspect ratio trapping process to form fins. The non-silicon containing semiconductor material includes at least one of a III-V material and a II-VI. In block 107, the one or more dielectric layers may be etched in a guard-ring area down to the substrate, and the non-silicon containing semiconductor material is grown in the guard-ring area.

In one embodiment, epitaxially growing the non-silicon containing semiconductor material includes growing the non-silicon containing semiconductor material above a height of the trench and planarizing the non-silicon containing semiconductor material to form the fins in block 108. In block 109, the one or more dielectric layers are etched to expose a portion of the fins.

In block 110, a barrier layer is epitaxially grown on the portion of the fins. In one embodiment, the fins include a III-V semiconductor material, and the barrier layer includes a III-V semiconductor material.

In block 112, a gate stack is formed over the fins in a transverse orientation relative to a longitudinal direction of the fins. The gate stack may include a conductor or a dummy gate structure. In block 114, a spacer is formed around the portion of the fins and the gate stack. In block 116, the fins are further processed by extension implants or fin chopping. In block 118, dopants are implanted into the portion of the fins. In block 120, the fins are etched (chopped) below at least a portion of the spacers.

In block 122, source and drain regions are formed over the fins using a non-silicon containing semiconductor material. The source and drain regions are formed over the fins by epitaxial growth and in-situ doping. In block 124, a metal is deposited over the source and drain regions and annealed to mix the metal and the non-silicon containing semiconductor material of the source and drain regions. In block 126 processing continues.

Having described preferred embodiments for III-V fin-FETS on a silicon substrate (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A fin field effect transistor, comprising:
    a substrate formed from a monocrystalline silicon or germanium material;
    a dielectric layer having trenches formed therein, the dielectric layer having a lower surface present on a first portion of an upper surface of the substrate;
    an etch stop layer atop the dielectric layer;
    a plurality of parallel fins formed from a III-V material in the trenches and being in contact with a second portion of the upper surface of the substrate that is adjacent and coplanar with the first portion of the upper surface of the substrate, the trenches being initially dimensioned and configured to have a high aspect ratio including a height to width ratio of greater than about 1:1 to enable non-lattice-matched crystalline III-V material to be formed on the substrate, wherein the high aspect ratio trenches provide that the III-V semiconductor is in direct contact with the silicon substrate and is a monocrystalline structure that is relatively defect free, a doped portion of the plurality of parallel fins being positioned above an upper surface of the etch stop layer and an undoped portion of the plurality of parallel fins being positioned below the etch stop layer;
    a gate stack including a barrier layer, a gate dielectric and a gate conductor formed transversely to the plurality of parallel fins, wherein the barrier layer is present on a sidewall and upper surface of the doped portion of the plurality of parallel fins; and
    raised source and drain regions formed from a III-V material and being in contact with the fins on opposite sides of the gate stack.

2. The transistor as recited in claim 1, wherein the fins include side wall spacers about a top portion and the top portion includes implanted dopants.

3. The transistor as recited in claim 1, wherein the fins include side wall spacers and the fin is recessed below spacers wherein a portion of the raised source and drain regions is formed between the spacers of each fin and in contact with the fin recessed below the spacers.

4. The transistor as recited in claim 1, further comprising a mixed metal layer formed over the raised source and drain regions.

5. The transistor as recited in claim 1, wherein the III-V material of the plurality of parallel fins is selected from the group consisting of AlInGaAs, AlGaAs, InGaP, InAs, GaN, GaSb, InSb, InGaAs, InP, GaAs, GaP and combinations thereof.

6. The transistor as recited in claim 1, wherein a composition of the dielectric layer is selected from the group consisting of silicon oxide, aluminum oxide, silicon nitride, silicon oxynitride and a combination thereof.

7. The transistor as recited in claim 1, wherein a composition of the gate dielectric is selected from the group consisting of silicon oxide, silicon oxynitride, hafnium oxide and combinations thereof.

8. The transistor as recited in claim 1, wherein a composition of the gate conductor is selected from the group consisting of copper, aluminum, tungsten, titanium nitride and a combination thereof.

9. The transistor as recited in claim 1, wherein the III-V material of the raised source and drain regions is selected from the group consisting of AlInGaAs, AlGaAs, InGaP, InAs, GaN, GaSb, InSb, InGaAs, InP, GaAs, GaP and combinations thereof.

10. The transistor as recited in claim 1 further comprising a guard ring present around an edge of the transistor.

* * * * *